United States Patent
Choi et al.

(10) Patent No.: US 6,930,343 B2
(45) Date of Patent: Aug. 16, 2005

(54) NONVOLATILE MEMORY DEVICE UTILIZING A VERTICAL NANOTUBE

(75) Inventors: Won-bong Choi, Suwon (KR); Jo-won Lee, Suwon (KR); Ho-kyu Kang, Yongin (KR); Chung-woo Kim, Seongnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 80 days.

(21) Appl. No.: 10/713,214

(22) Filed: Nov. 17, 2003

(65) Prior Publication Data

US 2004/0095837 A1 May 20, 2004

(30) Foreign Application Priority Data

Nov. 15, 2002 (KR) .................... 10-2002-0071041

(51) Int. Cl.⁷ .......................................... H01L 27/108
(52) U.S. Cl. .................... 257/296; 257/77; 257/296; 257/E51.04
(58) Field of Search .................... 257/296, E51.04, 257/77

(56) References Cited

U.S. PATENT DOCUMENTS 6,313,503 B1    11/2001  Lee et al.
6,515,325 B1 *   2/2003  Farnworth et al. .......... 257/296

FOREIGN PATENT DOCUMENTS

WO        WO 00/48195        8/2000

* cited by examiner

*Primary Examiner*—David Nelms
*Assistant Examiner*—Mai-Huong Tran
(74) *Attorney, Agent, or Firm*—Lee & Morse P.C.

(57) ABSTRACT

A nonvolatile memory device includes a substrate having a source region; a nanotube array including a plurality of nanotube columns that are vertically grown on the substrate such that a first end of the nanotube array is in contact with the source region, the nanotube array functioning as an electron transport channel; a memory cell formed around an outer side surface of the nanotube array; a control gate formed around an outer side surface of the memory cell; and a drain region in contact with a second end of the nanotube array and the memory cell, wherein the second end of the nanotube array is distal to the first end of the nanotube array.

14 Claims, 4 Drawing Sheets

NONVOLATILE MEMORY DEVICE UTILIZING A VERTICAL NANOTUBE

BACKGROUND OF THE INVENTION

1. Field of the Invention

The present invention relates to a nonvolatile memory device. More particularly, the present invention relates to a high-density memory device using a carbon nanotube as a vertical electron transport channel.

2. Description of the Related Art

Memory devices using a semiconductor generally include a transistor, which serves as a switch for forming a current path when information is written to or read from a capacitor, and a capacitor, which stores and preserves electrical charges. In order to provide a large-intensity current flow in the transistor, the transistor needs to have a high transconductance (gm) characteristic. Recently, a conventional Metal Oxide Semiconductor Field Effect Transistor (MOSFET) having a high transconductance characteristic has been used as a switching device for a semiconductor memory device to satisfy this requirement.

A conventional MOSFET mainly includes a control gate formed of doped polycrystalline silicon and a source and drain region formed of doped crystalline silicon. Under a same voltage condition, the transconductance of the MOSFET is inversely proportional to a channel length and a thickness of a gate oxide layer, but is proportional to a surface mobility, a dielectric constant of the gate oxide layer, and a channel width. Since the surface mobility and the dielectric constant of an oxide layer are predetermined according to material, such as a silicon wafer with an orientation and a silicon oxide layer, a high transconductance can be accomplished by increasing a ratio of the channel width to the channel length or decreasing the thickness of the oxide layer.

A physical size of the conventional MOSFET, however, needs to be reduced in order to manufacture a high-density memory device. Thus, a size of the gate and a size of the source and drain region also need to be reduced, which causes various problems.

For example, when the size of a control gate is reduced, a cross-sectional area of the control gate is reduced, which induces a large electrical resistance in a transistor. Reduction of the sizes of the source and drain region causes the thickness, i.e., junction depth, to be reduced. A reduction in the junction depth induces a large electrical resistance or occurrence of a punch-through phenomenon. The punch-through phenomenon occurs when a depletion layer of a source contacts a depletion layer of a drain due to a decrease in a distance between the source and the drain. Consequently, it is impossible to control a current flow. In addition, size reduction of such a memory device decreases the width of a channel functioning as a current path to below about 30 nm, thereby disturbing the flow of current. As a result of this disturbance, the memory device operates abnormally. Accordingly, the use of a conventional silicon MOSFET is limited in accomplishing a high-density memory device.

SUMMARY OF THE INVENTION

In an effort to solve at least some of the above-described problems, the present invention provides a high-density memory device that prevents a resistance from increasing due to miniaturization and reduces the risk of an abnormal operation by using a nanotube.

According to an embodiment of the present invention, a memory device includes a substrate having a source region, a nanotube array including a plurality of nanotube columns that are vertically grown on the substrate such that a first end of the nanotube array is in contact with the source region, the nanotube array functioning as an electron transport channel, a memory cell formed around an outer side surface of the nanotube array, a control gate formed around an outer side surface of the memory cell, and a drain region in contact with a second end of the nanotube array and the memory cell, wherein the second end of the nanotube array is distal to the first end of the nanotube array.

Preferably, the substrate is made of aluminum oxide, silicon, or a mesoporous material.

Preferably, the plurality of nanotube columns are made of carbon, boronitride, or gallium phosphate.

Preferably, the memory cell includes a first insulation layer formed around the outer side surface of the nanotube array; an electron storing layer formed around an outer side surface of the first insulation layer; and a second insulation layer formed around an outer side surface of the electron storing layer to be in contact with the control gate.

Preferably, the first insulation layer and the second insulation layer are silicon oxide layers. Preferably, the electron storing layer is a silicon layer or a silicon nitride layer. Preferably, the memory cell has a thickness of less than about 200 nm. Preferably, the electron storing layer has a thickness of about 100 nm or less.

The electron storing layer may be a porous layer including a plurality of nanodots, each of the nanodots being filled with an electron storing material. Preferably, the electron storing material is silicon or silicon nitride. Preferably, the porous layer is an aluminum oxide layer. Preferably, the nanodots have a diameter of about 100 nm or less.

Accordingly, the present invention provides a high-density and large capacity nonvolatile memory device by utilizing a nanotube as an electron transport channel and vertically arranging a plurality of nanotube columns.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
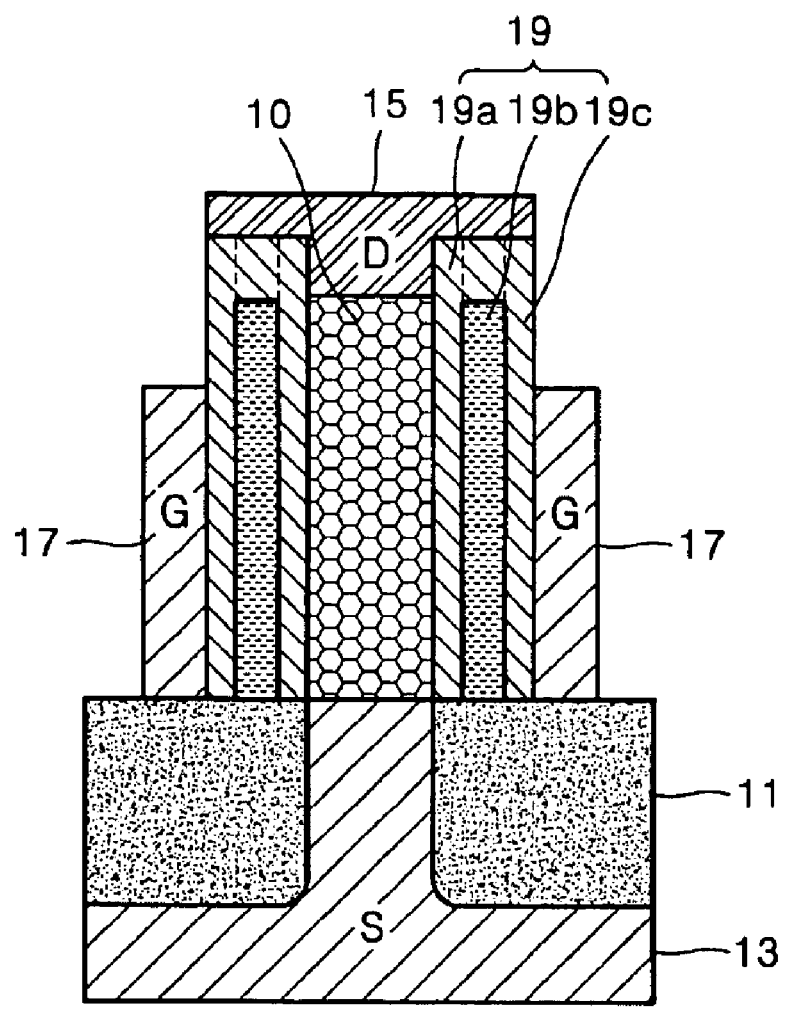
FIG. 1A illustrates a cross-sectional view of a memory device according to a first embodiment of the present invention.

Korean Patent Application No. 2002-71041, filed on Nov. 15, 2002, and entitled: "Nonvolatile Memory Device Utilizing a Vertical Nanotube," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

Figure 1B:
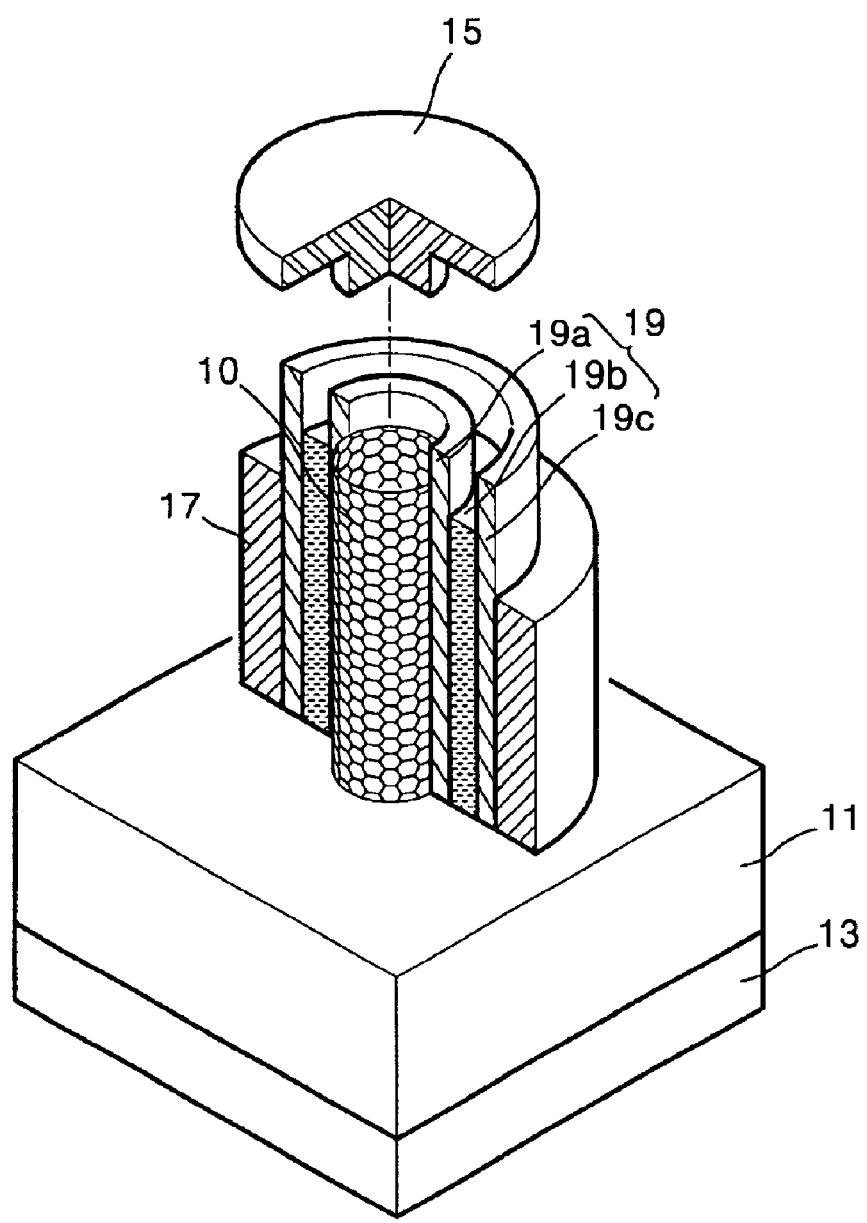
FIG. 1B illustrates a perspective view of a memory device according to the first embodiment of the present invention.

FIGS. 1A and 1B illustrate a cross-sectional and a perspective view, respectively, of a memory device according to a first embodiment of the present invention. Referring to FIGS. 1A and 1B, a substrate 11 includes a source region (S) 13. A nanotube column 10 is vertically positioned on a top surface of the substrate 11 to be connected to the source region 13. A memory cell 19 is formed around an outer surface of the nanotube column 10. A control gate (G) 17 is formed around an outer surface of the memory cell 19. A drain region (D) 15 is formed on a top surface of the nanotube column 10 and the memory cell 19. A plurality of memory devices having this structure may form an array on the substrate 11.

It is preferable that the substrate 11 is made of aluminum oxide ($Al_2O_3$), silicon (Si), or mesoporous material. The source region 13 is formed by doping the substrate 11 with ions.

The nanotube column 10 can be formed using a semiconductor nanotube such as a carbon nanotube, a boronitride (BN) nanotube, or a gallium phosphate nanotube. Nanotubes are divided into metal nanotubes and semiconductor nanotubes according to electrical characteristics. Metal nanotubes are not influenced by a gate voltage and have linear current-voltage characteristics. Semiconductor nanotubes are influenced by a gate voltage and have non-linear current-voltage characteristics. A memory device according to the present invention uses semiconductor nanotubes so that the flow of electrons, i.e., current, moving through the nanotube columns 10 may be controlled by applying a gate voltage to the control gate 17.

Carbon nanotubes utilized as nanotube columns 10 may be grown on the substrate 11 using arc discharge, laser vaporization, plasma-enhanced chemical vapor deposition (PECVD), thermal chemical vapor deposition, or a vapor phase growth such that a first end of each carbon nanotube columns 10 is in contact with the source region 13.

The memory cell 19 formed around the outer side surface of the nanotube column 10 may be made of an oxide-nitride-oxide (ONO) layer, in which oxide layers 19a and 19c function as insulation layers and a nitride layer 19b functions as an electron storing layer. The ONO layer may be formed using chemical vapor deposition (CVD) or heat treatment. The nitride layer 19b may be made of silicon nitride ($Si_3N_4$). Alternately, a silicon layer may be used instead of the nitride layer 19b. It is preferable that the thickness of the memory cell 19 is less than about 200 nm and the thickness of the electron storing layer 19b is about 100 nm or less.

The control gate 17 is formed around the outer side surface of the memory cell 19. The drain region 15 is formed on the top surface of the nanotube column 10 and the memory cell 19 to be in contact with a second end, which is distal to the first end, of the nanotube column 10.

Figure 2:
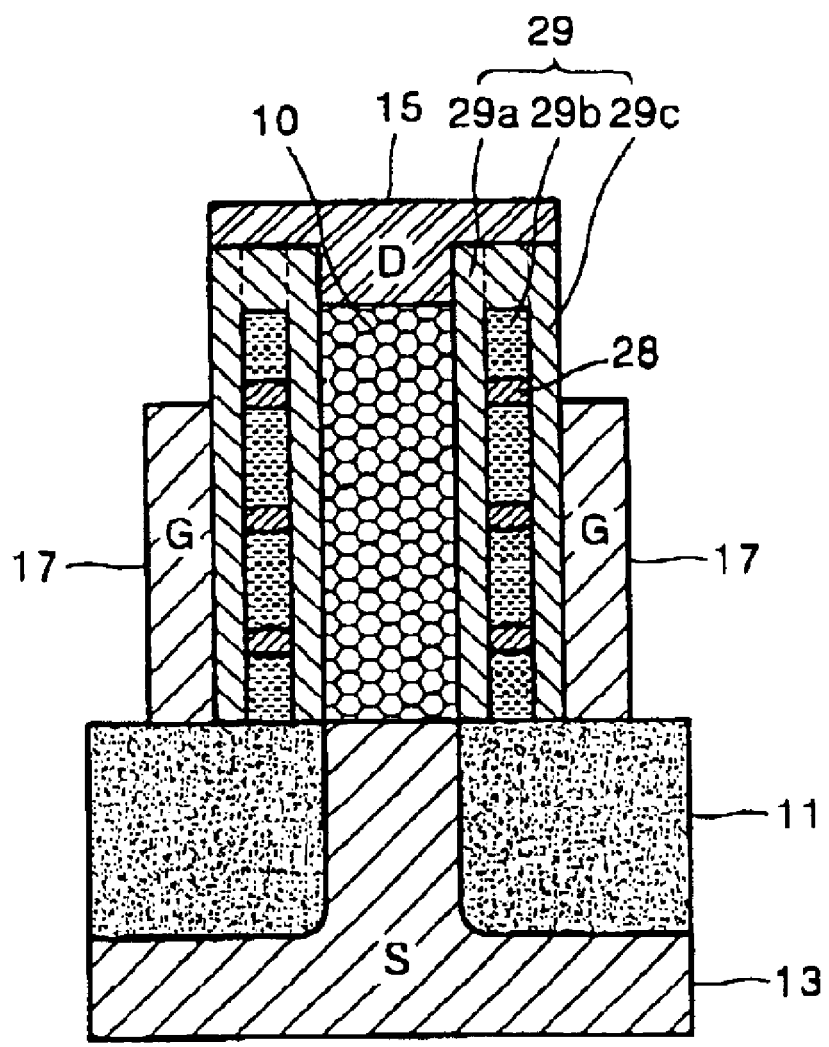
FIG. 2 illustrates a cross-sectional view of a memory device according to a second embodiment of the present invention.

FIG. 2 illustrates a cross-sectional view of a memory device according to a second embodiment of the present invention. The memory device shown in FIG. 2 has the same structure as the memory device according to the first embodiment, as shown in FIGS. 1A and 1B, with the exception that a memory cell 29 includes a porous layer 29b containing a nanodot 28 filled with an electron storing material. Reference numerals 29a and 29c indicate layers having the same functions as the oxide layers 19a and 19c, respectively, shown in FIGS. 1A and 1B.

When the porous layer 29b is formed, an electric power is applied to an aluminum substrate placed in a sulphuric acid solution or a phosphoric acid solution to anodize the aluminum substrate, thereby forming a plurality of nanodots 28. Subsequently, each of the nanodots 28 are filled with an electron storing material, such as silicon or silicon nitride, using CVD or sputtering. Thus, the porous layer 29b, which may be an aluminum oxide layer, functions as an electron storing layer. Preferably, each of the nanodots has a diameter of about 100 nm or less.

Figure 3:
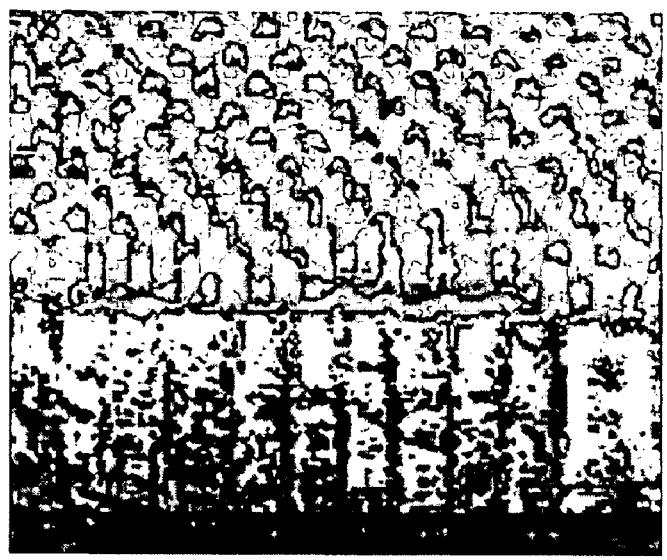
FIG. 3 is a photograph of carbon nanotubes grown on a substrate in order to manufacture a memory device according to the first embodiment of the present invention.

FIG. 3 is a photograph of carbon nanotubes grown on a substrate in order to manufacture a memory device according to the first embodiment of the present invention.

Figure 4:
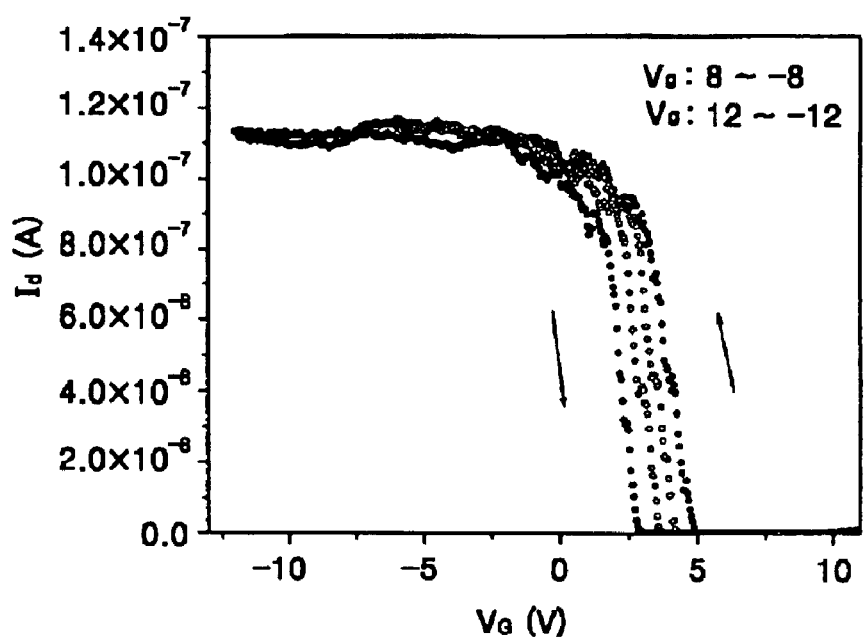
FIG. 4 is a graph showing current-voltage (I–V) characteristics of a memory device according to the first embodiment of the present invention.

FIG. 4 is a graph showing current-voltage (I–V) characteristics of a memory device according to the first embodiment of the present invention. Referring to FIG. 4, a drain current $I_d$ is maintained constant until a gate voltage increases from a negative value to zero (0) and then significantly decreases as the gate voltage increases above zero (0). More specifically, the memory device according to the first embodiment of the present invention clearly shows the operating characteristics of a high-density memory device.

According to the present invention, an ultrahigh density memory device can be implemented using nanotubes. Since the ultrahigh density memory device can be structured on a substrate without performing a doping process by using self-assembly when the present invention is implemented, manufacturing processes therefor can be simplified.

Preferred embodiments of the present invention have been disclosed herein and, although specific terms are employed, they are used and are to be interpreted in a generic and descriptive sense only and not for purpose of limitation. For example, other materials having an excellent ability to capture electrons can be used as an electron storing layer or material. Accordingly, it will be understood by those of ordinary skill in the art that various changes in form and details may be made without departing from the spirit and scope of the present invention as set forth in the following claims.

What is claimed is:

1. A memory device, comprising:
    a substrate having a source region;
    a nanotube array including a plurality of nanotube columns that are vertically grown on the substrate such that a first end of the nanotube array is in contact with the source region, the nanotube array functioning as an electron transport channel;
    a memory cell formed around an outer side surface of the nanotube array;
    a control gate formed around an outer side surface of the memory cell; and
    a drain region in contact with a second end of the nanotube array and the memory cell, wherein the second end of the nanotube array is distal to the first end of the nanotube array.

2. The memory device as claimed in claim 1, wherein the substrate is made of one material selected from the group consisting of aluminum oxide, silicon, and a mesoporous material.

3. The memory device as claimed in claim 1, wherein the plurality of nanotube columns are made of one material selected from the group consisting of carbon, boronitride, and gallium phosphate.

4. The memory device as claimed in claim 1, wherein the memory cell comprises:

a first insulation layer formed around the outer side surface of the nanotube array;

an electron storing layer formed around an outer side surface of the first insulation layer; and a second insulation layer formed around an outer side surface of the electron storing layer to be in contact with the control gate.

5. The memory device as claimed in claim 4, wherein the first insulation layer and the second insulation layer are silicon oxide layers.

6. The memory device as claimed in claim 4, wherein the electron storing layer is a silicon layer or a silicon nitride layer.

7. The memory device as claimed in claim 1, wherein the memory cell has a thickness of less than about 200 nm.

8. The memory device as claimed in claim 4, wherein the electron storing layer has a thickness of about 100 nm or less.

9. The memory device as claimed in claim 4, wherein the electron storing layer is a porous layer including a plurality of nanodots, each of the plurality of nanodots being filled with an electron storing material.

10. The memory device as claimed in claim 9, wherein the electron storing material is one of silicon and silicon nitride.

11. The memory device as claimed in claim 9, wherein the porous layer is an aluminum oxide layer.

12. The memory device as claimed in claim 9, wherein the nanodots have a diameter of about 100 nm or less.

13. The memory device as claimed in claim 10, wherein the nanodots have a diameter of about 100 nm or less.

14. The memory device as claimed in claim 11, wherein the nanodots have a diameter of about 100 nm or less.

* * * * *